United States Patent [19]
Mohsen

[11] Patent Number: 5,077,451
[45] Date of Patent: * Dec. 31, 1991

[54] CUSTOM TOOLED PRINTED CIRCUIT BOARD

[75] Inventor: Amr M. Mohsen, Saratoga, Calif.

[73] Assignee: Aptix Corporation, San Jose, Calif.

[*] Notice: The portion of the term of this patent subsequent to Oct. 8, 2008 has been disclaimed.

[21] Appl. No.: 642,613

[22] Filed: Jan. 17, 1991

Related U.S. Application Data

[62] Division of Ser. No. 466,153, Jan. 17, 1990.

[51] Int. Cl.⁵ .......................................... H05K 01/00
[52] U.S. Cl. .................... 174/261; 361/414; 439/55
[58] Field of Search .................. 174/261; 361/414; 439/43, 44, 45, 47, 55, 68

[56] References Cited

U.S. PATENT DOCUMENTS 4,821,142 4/1989 Ushifusa et al. ............... 361/414
4,840,924 6/1989 Kinbara ............................ 174/261
4,860,165 8/1989 Cassinelli ......................... 361/414

Primary Examiner—Leo P. Picard
Assistant Examiner—Trinidad Korka
Attorney, Agent, or Firm—Skjerven, Morrill, MacPherson, Franklin & Friel

[57] ABSTRACT

A printed circuit board contains a plurality of component contacts for receipt of electronic components and a plurality of electrically conductive traces, each trace being electrically connected to a corresponding one of the component contacts. A corresponding plurality of interconnect holes is formed on a selected portion of the printed circuit board with each interconnect hole contacting uniquely a corresponding one of the plurality of electrically conductive traces. A multiplicity of custom conductive traces are then formed in the interconnect region such that each of the multiplicity of conductive traces interconnects at least one of the interconnect holes to at least one other interconnect hole thereby to form an electrically conductive path between each of the interconnect holes interconnected by the custom conductive traces. A user is thus able to achieve a desired electrical function from the electronic components to be connected to the printed circuit board.

5 Claims, 3 Drawing Sheets

CUSTOM TOOLED PRINTED CIRCUIT BOARD

This application is a division of application Ser. No. 07/466,153, filed Jan. 17, 1990.

FIELD OF THE INVENTION

This invention relates to printed circuit boards and in particular to a printed circuit board which is custom programmable by the designer of an electronic system so as to implement a desired function typically, though not necessarily, using a field programmable printed circuit board of the type described in copending U.S. Pat. Application Ser. No. 07/410,194 filed Sep. 20, 1989 by Amr M. Mohsen and entitled "Field Programmable Printed Circuit Board".

BACKGROUND OF THE INVENTION

Printed circuit boards are commonly used in electronic devices such as instruments, computers, telecommunication equipment and consumer electronic products. Typically, an engineer will design a printed circuit board to carry the types of components necessary to implement the desired electronic function and to fit in the space available for the board. Consequently, each printed circuit board typically is custom designed. To design a custom printed circuit board is expensive, takes time and requires the fabrication of prototype printed circuit boards. If errors are found in the prototypes, then the printed circuit board must be redesigned. Such a process often delays the planned introduction of a new product.

To alleviate this problem I invented a field programmable printed circuit board which is described in my above referenced copending patent application. In accordance with my invention described in the above referenced application, I provide a printed circuit board of unique configuration combined with one or more special programmable integrated circuit chips (hereinafter called "programmable interconnect chips" or "PICs") to provide a user programmable printed circuit board capable of being used to provide any one of a plurality of functions. As described in the above referenced application, in one embodiment of that invention, a field programmable printed circuit board comprises:

(1) a multiplicity of component contacts for receipt of the leads of electronic components;

(2) a corresponding multiplicity of PIC contacts for receipt of the leads on the package or packages of the programmable interconnect chip or chips; and (3) one or more layers of conductive traces, each conductive trace uniquely connecting one component contact to one PIC contact.

Typically, electronic components comprise integrated circuits and/or discrete devices contained, respectively, in standard integrated circuit or discrete device packages and in addition, discrete elements which include resistors, capacitors and inductors, for example. As described in the above-mentioned application, each PIC contact brings a corresponding trace from a selected level on the PC board to the surface of the PC board so that trace is then connectable to a pin or electrical contact on a programmable interconnect chip. For every component contact, (the function of which is to receive the pin or electrical contact of an electronic component,) there is a corresponding electrically conductive trace which interconnects that component contact to a corresponding PIC contact (the function of which is to receive and electrically contact the pin or electrical contact of the programmable interconnect chip) in the printed circuit board. Thus, each component contact is electrically and uniquely connected to a corresponding PIC contact.

For printed circuit boards to be produced in high volume it is desirable to reduce the number of integrated circuit chips to be placed on the printed circuit board.

SUMMARY OF THE INVENTION

In accordance with this invention a custom tooled printed circuit board is provided that has the electrical characteristics substantially similar to the electrical characteristics of the field programmable printed circuit board described in the above-referenced application without the use of the programmable interconnect chip.

As an advantage of this invention, engineers who first implement their system design with the field programmable printed circuit board for prototype and debugging purposes are able to implement their design in high volume and at low cost without the need to re-engineer new custom tooled printed circuit board. The avoidance of the redesign of a new custom tooled PC board eliminates two to three months of time and saves a substantial engineering effort and thus the comparable cost associated with this effort. Thus an engineer who employs the field programmable printed circuit board described in the above-referenced application to implement his system is able, using this invention, to obtain a custom tooled printed circuit board at a low cost with approximately the same electrical characteristics as the field programmable printed circuit board.

In accordance with this invention, the field programmable PCB of my invention described in the above-mentioned application contains two areas, one containing component holes and the other containing PIC holes. The PIC holes are typically on a small portion of the surface of the printed circuit board. In accordance with this invention, the area containing the PIC holes is enlarged slightly so as to be capable of receiving traces to allow connection between any two or more PIC holes (also sometimes called "PIC vias" or "PIC pads") in the PIC or interface area. All of the layers of traces used to connect component holes to PIC holes in the field programmable PCB are used in the custom tooled PCB of this invention together with one additional trace layer. This additional trace layer allows the interconnection of selected PIC vias or PIC pads at the edge of the PIC area or interface area or when it is otherwise impossible to connect two PIC holes, PIC vias or PIC pads using traces on the PC board layers containing conductive traces connecting component holes to PIC holes, PIC vias or PIC pads.

This invention will be more fully understood in conjunction with the following detailed description taken together with the following drawings.

DETAILED DESCRIPTION

The following description is meant to be illustrative only and not limiting. Other embodiments of this invention will be obvious to those skilled in the art in view of this description.

The field programmable printed circuit board upon which this invention is based is described in detail in the above-mentioned U.S. Pat. Application Ser. No. 07/410,194 hereinafter the "'194 application"). The '194 application in its entirety is hereby incorporated by reference into this application.

Figure 1:
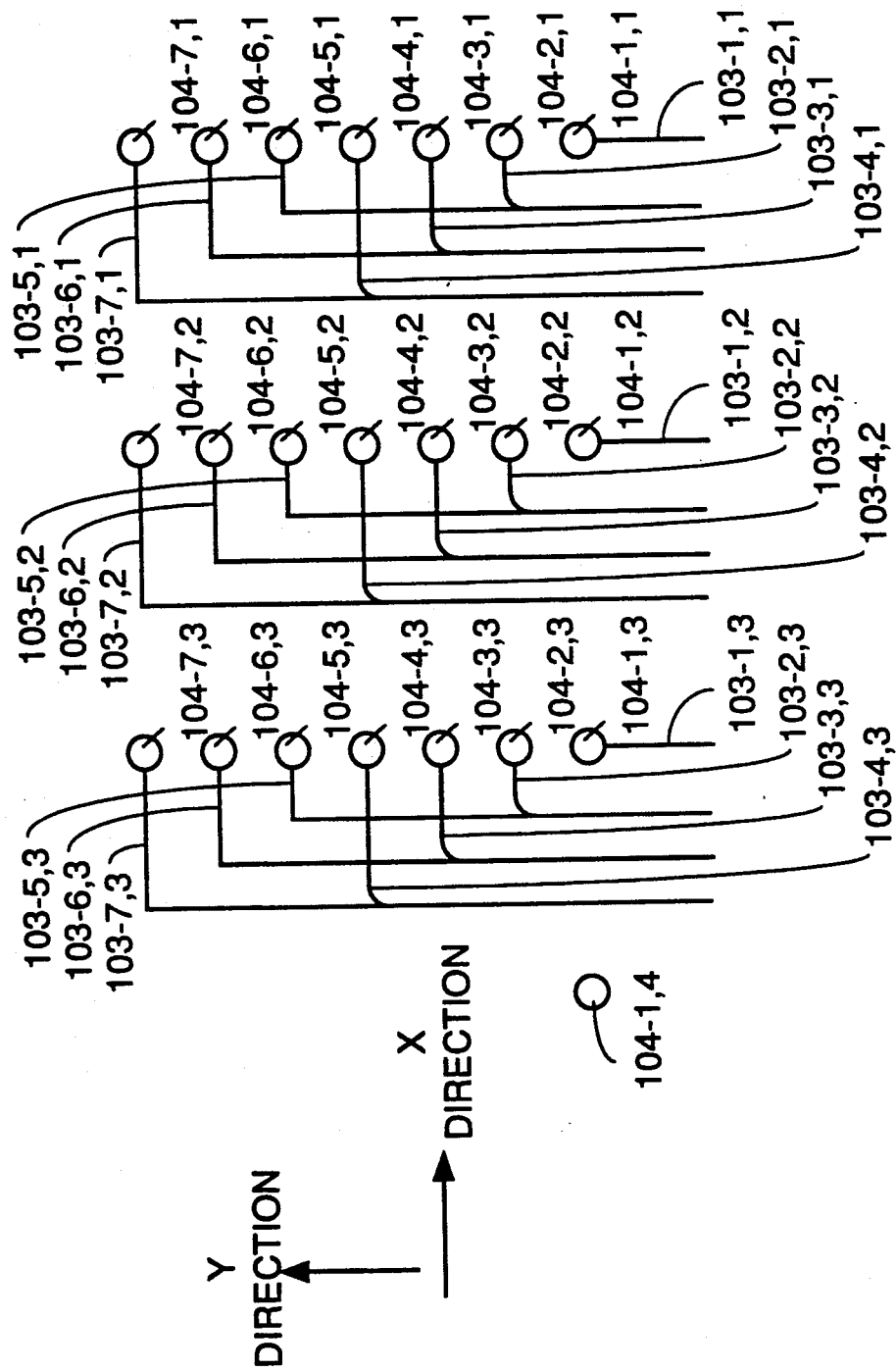
FIG. 1 illustrates the trace architecture for the field programmable PCB in the area of the PIC holes in accordance with the field programmable printed circuit board described in my copending Application Ser. No. 07/410,194.

As shown in FIG. 1, the traces 103-r,c from the component holes 102-r,c in FIG. 1a of the '194 application (holes 102-r,c are not shown in the Figures of this application) are brought on their respective layers 101-1 through 101-L, where L is the maximum number of layers, to the region of the printed circuit board containing the PIC holes 104-1,1 through 104-R,C. R is the total number of rows of component holes 102 on the printed circuit board and C is the total number of columns of component holes 102 on the printed circuit board, r is given by $1 \leq r \leq R$ and c is given by $1 \leq c \leq C$. As stated in the above-referenced '194 application, each component hole 102-r,c has a uniquely corresponding PIC hole 104-r,c and is connected thereto by a conductive trace 103-r,c. A programmable interconnect chip 105 (shown in FIG. 1a of the '194 application) makes electrical contact with each PIC hole 104-r,c. The programmable interconnect chip 105 then is configured by the user, as discussed in the '194 application, to interconnect selected component holes 102-r,c by means of the proper configuration of the switching elements on the programmable interconnect chip 105. FIG. 1 illustrates a portion of the interface area of the field programmable printed circuit board containing a number of PIC holes 104-r,c arranged to receive a programmable interconnect chip. Of importance, the leads or conductive traces 103-r,c run for the most part in the y direction. No leads 103-r,c run a substantial distance in the x direction. Moreover, the leads 103-r,c on the first layer 101-1 of the printed circuit board contact the PIC holes 104-r,c in the first few rows (for example, the PIC holes 104-1,x through 104-4,x in rows one through four) while the leads 103-r,c on the second layer 101-2 of the printed circuit board contact the PIC holes 103-r,c in a few of the following rows (for example, PIC holes 104-5,x through 104-8,x in rows five through eight). Accordingly, the PC board can be custom designed by adding one more layer 101-(L+1) of PC board material to allow conductive traces to be formed thereon to interconnect two PIC holes 104 which otherwise could not be connected with conductive traces on PC board layers 101-1 through 101-L. This additional layer 101-(L+1) allows a custom designed series of traces to be placed in the interface area of the PCB board.

In general, a particular PIC hole is connected to a component hole by a trace formed on a selected layer of the PC board Therefore, any PIC hole can be connected to any other PIC hole in general by forming an interconnection trace on those layers of the PC board not containing traces contacting the two PIC holes to be interconnected. The additional layer for the placement of traces gives added flexibility to the designer to allow the interconnection of two PIC holes which otherwise would not be able to be interconnected because of previously existing traces on the other PC board layers.

Figure 2:
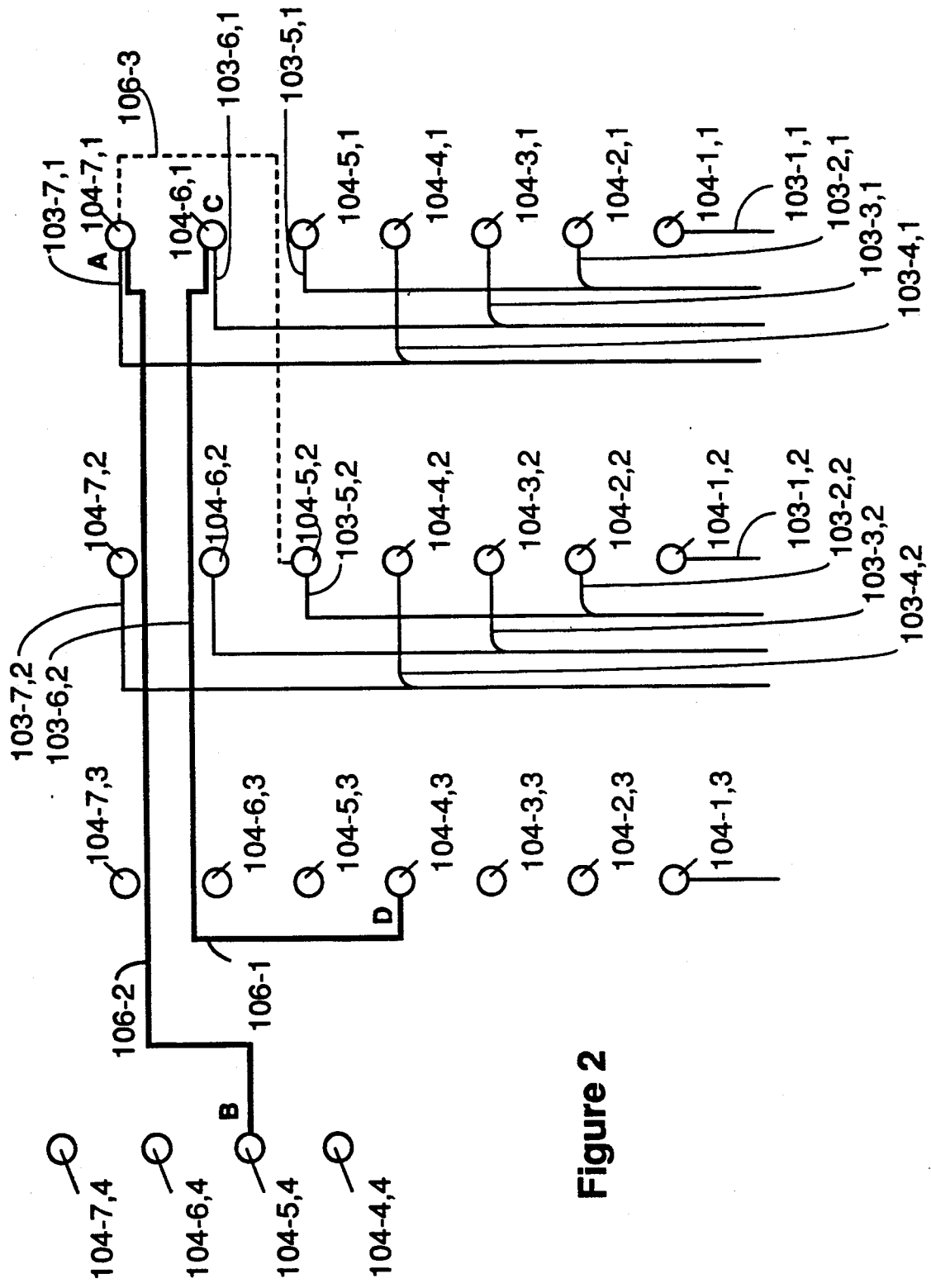
FIG. 2 illustrates the custom tooled printed circuit board of this invention to connect two nodes on the printed circuit board directly.

FIG. 2 illustrates such an interconnection. As shown in FIG. 2, the PIC holes 104 are spaced apart slightly further than in FIG. 1 to allow room for traces which travel predominantly in the x direction across the PCB to interconnect to PIC holes 104 thereby to eliminate the programmable interconnect chip 105 described in my above referenced copending application. As illustrated in FIG. 2, PIC hole 104-6,1 is connected by trace 106-1 to PIC hole 104-4,3. PIC hole 104-6,1 is connected to its component hole 102-6,1 (not shown in FIGS. 1, 2 and 3) by a conductive trace 103-6,1 on the second layer 101-2 of PC board material while component hole 104-4,3 is connected to its corresponding component hole 102-4,3 (also not shown in FIGS. 1, 2 and 3) by a conductive trace 103-4,3 (not shown in FIG. 2) on the first layer 101-1 of PCB board material. Because no conductive traces 103-r,c from component holes 102-r,c to PIC holes 104-r,c are formed on the first layer 101-1 of PCB board material beyond row 4, trace 106-1 can be formed on the first layer 101-1 of PCB board material.

Next PIC hole 104-7,1 which is connected to its corresponding component hole 102-7,1 by a conductive trace 103-7,1 on the second layer 101-2 of PCB material is connected by trace 106-2 to PIC hole 104-5,4. PIC hole 104-5,4 is connected to its corresponding component hole 102-5,4 (shown in the '194 application) by a conductive trace 103-5,4 (not shown in FIG. 2) on the second layer 101-2 of PC board material. Because none of the conductive traces 103-r,c on the first layer 101-1 of PCB board material extend beyond row 4 of PIC holes 104 and because conductive trace 106-1 does not cross the proposed path of conductive trace 106-2, conductive trace 106-2 can also be formed on the first layer 101-1 of PC board material. Should, however, PIC hole 104-7,1 be required to be connected to PIC hole 104-5,2, the first layer 101-1 of PC board material can also be used but the conductive trace would then follow the dashed line 106-3 as shown. Should it not be possible to interconnect two PIC holes 104 on the already existing layers of PC board material, an additional layer 101-(L+1) of PC board material is added on which no conductive traces are formed connecting component holes to corresponding PIC holes. This conductive layer 101-(L+1) provides additional interconnect flexibility to the design of the custom PC board in accordance with this invention. This additional layer 101-(L+1) can be placed on the bottom, on the top or in between any two of the PC board layers 101 already formed on the PC board.

The architecture of the traces 106 illustrated in FIG. 2 allows the same length trace, the same loading capacitance and the same cross-coupling on the custom tooled printed circuit board in accordance with this invention as on the field programmable printed circuit board described in my above-referenced copending application. The track length of the printed circuit board conductive traces 103 will increase slightly in the interface area (that is, the area where formerly the programmable interconnect chip 105 was placed) because the space between the PIC holes 104 is increased slightly to accommodate the interconnection tracks 106.

The tracks 106 which interconnect selected PIC holes 104 will add capacitance comparable to the programmable interconnect chip 105 capacitance. The resistance of the interconnects on the programmable interconnect chip 105 (sometimes called programmable interconnect substrate or "PIS") will be larger than on the custom tooled printed circuit board of this invention. However, through the use of simulation software to simulate various interconnection schemes, the impact of the resistance on the connection delays can be simulated and the circuit properly configured. Typically, the effect of this resistance on delay is a fraction of the total delay in the circuit.

One of the features of this invention is that the standard programmable printed circuit board described in the above-mentioned U.S. patent application is modified by custom programming interconnections in the interface area of the PC board. The interface area comprises that portion of the field programmable PC board above which the programmable interconnect chip or chips are placed. In accordance with this invention, the programmable interconnect chip is replaced by traces 106 formed to interconnect the various traces 103 from the component holes 102 on the field programmable printed circuit board into the desired configuration to yield the desired system and function. The interface area contains the "via holes" which are used to interconnect traces on different layers of the PC board to form the desired circuit. The portion of the printed circuit board containing the component holes 102 is unaltered by the formation of the custom traces 106 in the interface area of the PC board. The custom traces are formed using standard printed circuit board fabrication techniques. The advantage of this invention however is that the custom traces 106 are formed over a much smaller portion of the printed circuit board thereby reducing substantially the engineering costs associated with the fabrication of the custom portion of the PC board In addition, the turn-around time is substantially reduced because the operation of the circuit can first be verified using the field programmable printed circuit board of the above-referenced application with the result that engineering time and effort are substantially reduced.

While the invention has been described as utilizing one additional layer 101-(L+1) on the printed circuit board, of course, more than one additional layer can be used, if desired, to improve the flexibility of interconnection and to reduce the additional area increase of the interface when the programmable interconnect chip is replaced with the custom interconnects 106 of this invention.

The custom traces 106 formed in the interface area of the field programmable printed circuit board to convert this printed circuit board to a custom programmable printed circuit board are defined using computer aided design tools including algorithms of a type well known in the art.

Figure 3:
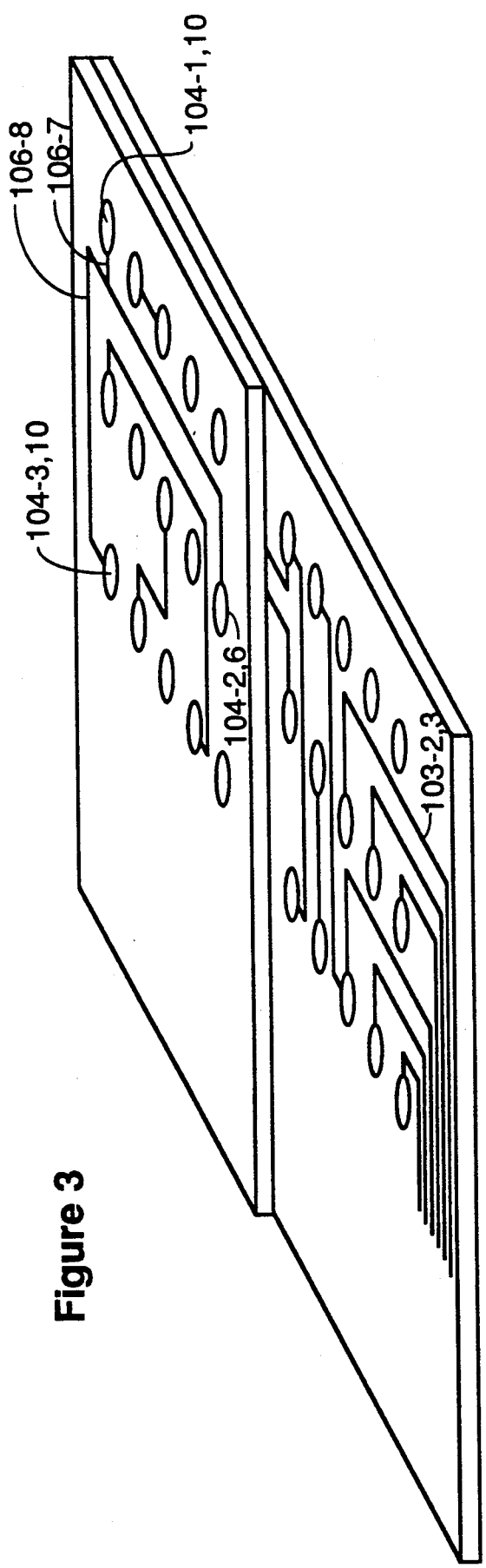
FIG. 3 illustrates an isometric, cutaway view of the PIC area (also called TMP interface area) configured to a custom configuration by the custom interconnections of this invention.

FIG. 3 illustrates in isometric view the conductive traces 106 of this invention formed in the interface area of the programmable printed circuit board to interconnect selected vias or holes 104 in accordance with the required circuit configuration. Note that conductive traces 106 can interconnect a PIC hole 104 directly to a conductive trace 103 or to another conductive trace 106 depending upon the requirements of the circuit. Thus conductive trace 106-7 interconnects PIC hole 104-1,10 to conductive trace 106-8 which in turn interconnects conductive holes 104-3,10 and 104-2,6.

Other embodiments of this invention will be apparent to those skilled in the art in view of the above disclosure.

I claim:

1. Structure comprising:
    a printed circuit board containing a first region and an interface area;
    a plurality of component contacts formed in said first region of said printed circuit board for receipt of electronic components;
    a plurality of electrically conductive traces formed on said printed circuit board, each trace being electrically connected to a corresponding one of said component contacts;
    a corresponding plurality of interconnect contacts formed in said interface area of said printed circuit board, each interconnect contact being connected uniquely to a corresponding one of said component contacts by one of said plurality of electrically conductive traces; and
    a multiplicity of custom conductive traces formed on said printed circuit board in said interface area, each of said custom conductive traces interconnecting at least two of said interconnect contacts thereby to form an electrically conductive path between said at least two interconnect contacts.

2. Structure as in claim 1 wherein said component contacts comprise holes formed through said printed circuit board, each of said holes being plated with a conductive material.

3. Structure as in claim 2 wherein said interconnect contacts comprise holes formed through said printed circuit board, each of said holes being coated on its interior surface with a conductive material.

4. Structure as in claim 1 wherein said printed circuit board contains at least two layers of insulating material, each of said two layers containing thereon a subset of said plurality of electrically conductive traces.

5. Structure as in claim 1 wherein said printed circuit board includes at least one additional layer of insulating material containing none of said plurality of electrically conductive traces, said at least one additional layer being suitable for containing one or more of said multiplicity of custom conductive traces formed on said printed circuit board in said interface area.

* * * * *